(12) United States Patent
Nakamura et al.

(10) Patent No.: US 7,686,665 B2
(45) Date of Patent: Mar. 30, 2010

(54) MANUFACTURING METHOD OF A PRINTED MATTER AND A PRINTED MATTER

(75) Inventors: Akio Nakamura, Tokyo (JP); Sen Ihan, Tokyo (JP); Kouji Takeshita, Tokyo (JP); Eiichi Kitazume, Tokyo (JP)

(73) Assignee: Toppan Printing Co., Ltd. (JP)

( * ) Notice: Subject to any disclaimer, the term of this patent is extended or adjusted under 35 U.S.C. 154(b) by 783 days.

(21) Appl. No.: 11/446,280

(22) Filed: Jun. 2, 2006

(65) Prior Publication Data

US 2007/0066179 A1 Mar. 22, 2007

(30) Foreign Application Priority Data

Sep. 22, 2005 (JP) ............... 2005-275264

(51) Int. Cl.
*H01J 9/00* (2006.01)
(52) U.S. Cl. ............... 445/24; 313/504; 313/506
(58) Field of Classification Search ......... 313/498–512; 445/24
See application file for complete search history.

(56) References Cited

U.S. PATENT DOCUMENTS

| | | | |
|---|---|---|---|
| 6,137,459 A * | 10/2000 | Eida et al. ............... | 345/76 |
| 6,420,200 B1 | 7/2002 | Yamazaki et al. | |
| 6,582,504 B1 | 6/2003 | Fujita | |
| 2002/0047560 A1* | 4/2002 | Lee et al. ............... | 315/169.3 |
| 2004/0021413 A1 | 2/2004 | Ito et al. | |
| 2004/0202778 A1* | 10/2004 | Nishiguchi et al. ............ | 427/68 |
| 2005/0093441 A1* | 5/2005 | Uhlig et al. ............... | 313/506 |
| 2005/0196969 A1* | 9/2005 | Gunner et al. ............... | 438/725 |

FOREIGN PATENT DOCUMENTS

| JP | 05-078655 | 3/1993 |
|---|---|---|
| JP | 10-012377 | 1/1998 |
| JP | 10-077467 | 3/1998 |
| JP | 11-024604 | 1/1999 |
| JP | 2001-076873 | 3/2001 |
| JP | 2001-093668 | 4/2001 |
| JP | 2001-155858 | 6/2001 |
| JP | 2001-155861 | 6/2001 |
| JP | 2001-185360 | 7/2001 |
| JP | 2001-291587 | 10/2001 |
| JP | 2002-100472 | 4/2002 |
| JP | 2002-305077 | 10/2002 |

(Continued)

*Primary Examiner*—Bumsuk Won
(74) *Attorney, Agent, or Firm*—Squire, Sanders & Dempsey L.L.P.

(57) ABSTRACT

The present invention is related to a printed matter on which thin film is formed by a printing method. Functional organic thin film is formed in little process with highly precise on a substrate without water absorbing property sectioned by partition walls. According to the current invention, the printing that accuracy is preferable can be achieved only by alignment in only one direction. In addition, yield of manufacture of printed matter is preferable. In addition, configuration of partition wall is configuration that printing plate is easy to approach one part of partition wall. Therefore, ink is transferred surely from printing plate to a substrate. Even more particularly, problem such as disconnection of the functional layer or substrate on partition wall when the functional layer or substrate is laminated on a top face of printed matter can be prevented.

11 Claims, 18 Drawing Sheets

FOREIGN PATENT DOCUMENTS

| | | |
|---|---|---|
| JP | 2002-313561 | 10/2002 |
| JP | 2003-059654 | 2/2003 |
| JP | 2003-059656 | 2/2003 |
| JP | 2003-243163 | 8/2003 |
| JP | 2003-282244 | 10/2003 |
| JP | 2004-055333 | 2/2004 |
| JP | 2004-063359 | 2/2004 |
| JP | 2004-355913 | 12/2004 |
| WO | WO 99/10862 | 4/1999 |

* cited by examiner

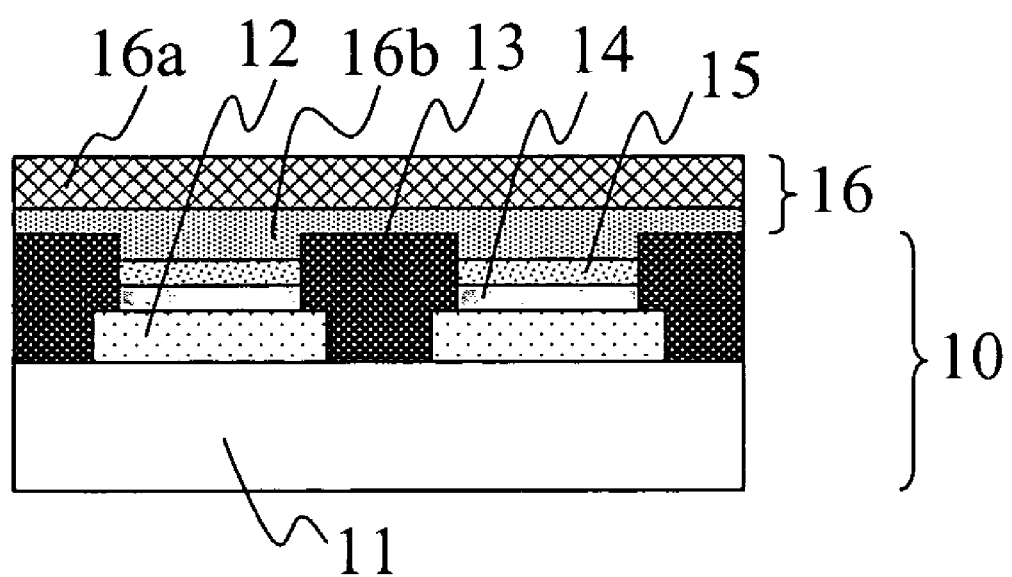
F I G . 1 A

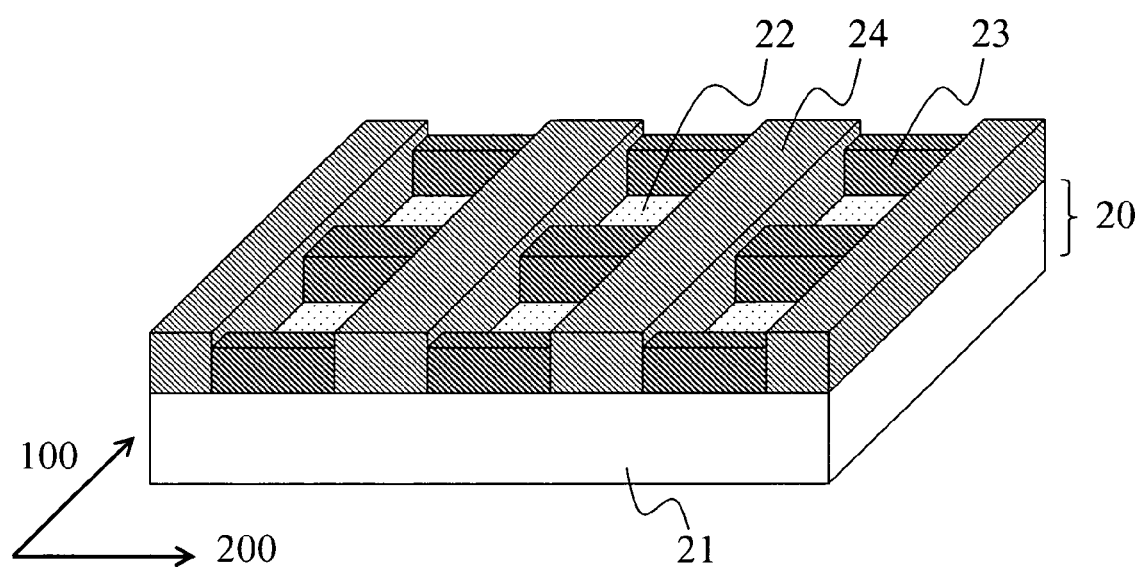
F I G . 2

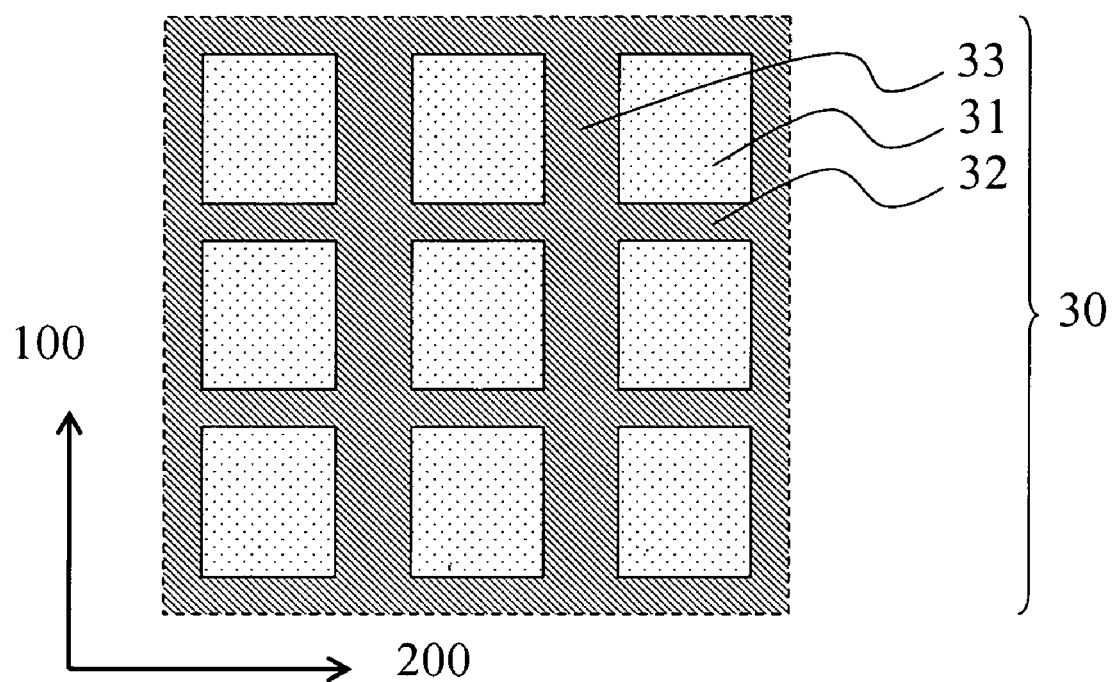
F I G . 3

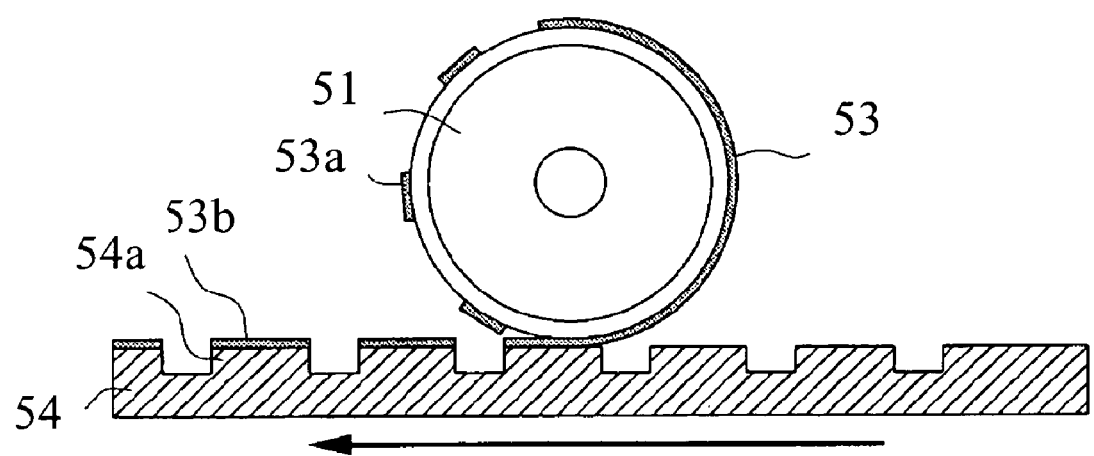
F I G. 5 B

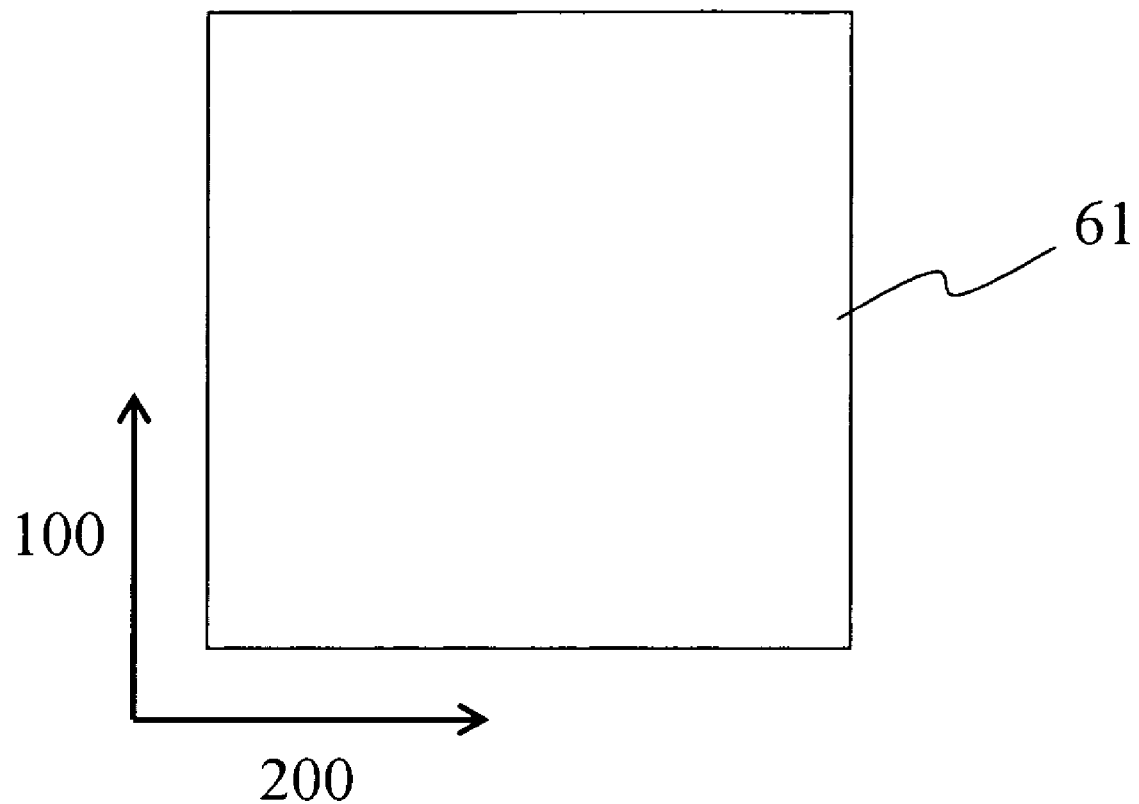
F I G . 6 A

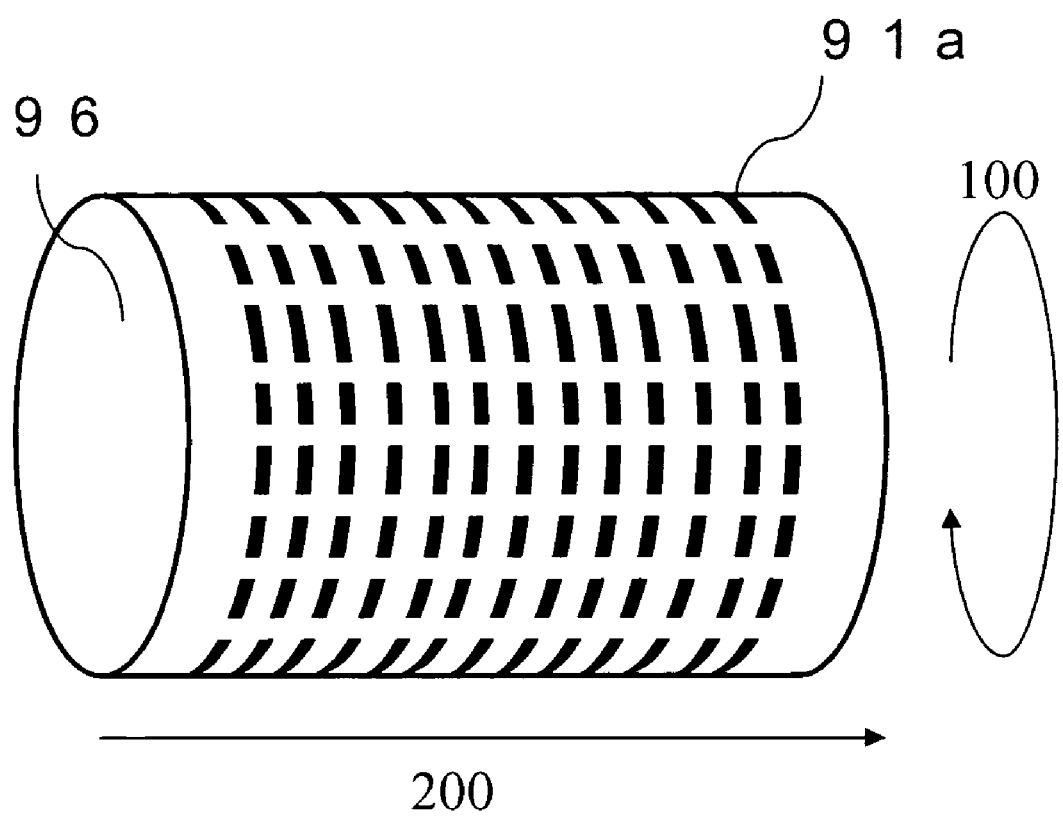
F I G. 9 A

MANUFACTURING METHOD OF A PRINTED MATTER AND A PRINTED MATTER

CROSS REFERENCE

This application claims priority to Japanese application number 2005-275264, filed on Sep. 22, 2005, which is incorporated by reference.

BACKGROUND OF THE INVENTION

1. Field of the Invention

The present invention is related to a printed matter on which thin film is formed by a printing method. The present invention is related to a method to form functional organic thin film on a substrate sectioned by partition wall in particular. Above all, the present invention is related to an organic electroluminescent device used for display units such as information display terminal or plane emission light source.

2. Description of the Related Art

In late years optical display units of various sizes are used as a display unit of information display terminal.

Above-all, display unit with the use of organic electroluminescent device is self-luminous type. Therefore, as for the organic electroluminescent device, speed of response is fast, and, in addition, power consumption is low. Therefore, organic electroluminescent device attracts attention as a display unit of the next generation.

Configuration of organic electroluminescent device is the configuration which luminous layer including organic luminescent material was sandwiched between a first electrode and a secondary electrode. When voltage is applied between these electrodes, hole poured by one electrode and electron poured by the other electrode couple again in luminous layer. Light occurring in this case is used as image display or light source.

On/off adjustment of luminescence of each pixel is necessary to display an image using organic electroluminescent device. Therefore it is necessary for electrode on one side to be form of pattern. Usually, for example, a first electrode formed on a substrate is etched. There is step in an end of pattern-shaped first electrode on a substrate. Organic luminescence media layer such as a hole transport layer or luminous layer on first electrode cannot completely cover this step. So this configuration may cause a short circuit. Therefore an end of first electrode should be covered by an insulating material. In addition, inks on neighboring pixels are mixed or are connected when a hole transport layer and a luminous layer on first electrode are formed by using liquid ink by means of a method to discharge ink from nozzle or a printing method. Partition wall should be formed to prevent this phenomenon. Thus, along each first electrode, partition wall is formed. Shape of partition wall of organic electroluminescent device of passive type is stripe shape. Partition wall of organic electroluminescent device of active type is lattice-shaped. (Japanese Patent Laid-Open No. 11-810862 Official Gazette).

Ink is hard to be scattered in the method that ink is filled between partition walls by printing, in comparison with a method to supply ink from nozzle. Therefore, in the method that ink is filled between partition walls by printing, partition walls may be low. However, in a printing method, if printing plate having pattern does not correspond with a substrate one-on-one, printing cannot be performed. In addition, aligning is necessary, too.

SUMMARY OF THE INVENTION

The present invention is related to a printed matter on which thin film is formed by a printing method. Functional organic thin film is formed in little process with highly precise on a substrate sectioned by partition walls.

According to the current invention, the printing that accuracy is preferable can be achieved only by alignment in only one direction. In addition, yield of manufacture of printed matter is preferable. In addition, configuration of partition wall is configuration that printing plate is easy to approach one part of partition wall. Therefore, ink is transferred surely from printing plate to a substrate. Even more particularly, problem such as disconnection of the functional layer or substrate on partition wall when the functional layer or substrate is laminated on a top face of printed matter can be prevented.

BRIEF DESCRIPTION OF THE DRAWINGS

FIG. 1A shows cross figure of one embodiment of printed matter of the present invention.

FIG. 2 shows a perspective view of an example of the substrate which can be used with the present invention.

FIG. 3 is a top view of other example of the substrate which can be used with the present invention.

FIGS. 5A, 5B and 5C are schematic views explaining other example of the printing process that can be used with the present invention.

FIGS. 6A, 6B and 6C are flow sheets which show one embodiment of a manufacturing method of the present invention.

FIG. 9A shows a schematic view of plastic plate having dot-shaped printing area (convex part).

Figure 1B:
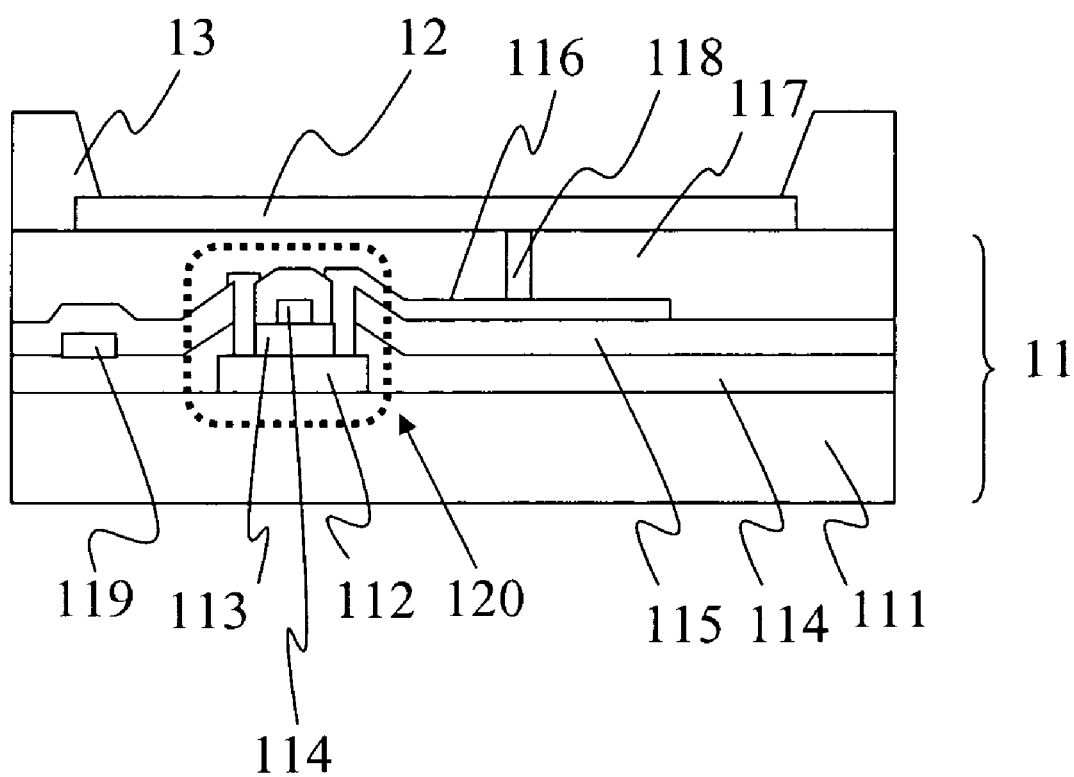
FIG. 1B is cross figure of an example of the substrate which can be used with the present invention.

In these drawings, 10 is an organic electroluminescent device; 11 is a substrate; 12 is a first electrode; 13 is a partition wall; 14 is an organic luminescence media layer; 15 is a second electrode; 16 is a body to seal; 16a is a sealing medium; 16b is a resin layer; 111 is a support medium; 112 is an active layer; 113 is a gate insulator; 114 is a gate electrode; 115 is an interlayer dielectric; 116 is a drain electrode; 117 is planarizing layer; 118 is a contact hole; 119 is a data line; 120 is a thin film transistor; 20 and 30 each are substrates; 21 is a substrate; 22 and 31 each are first electrodes; 23 and 32 each are the second partition walls; 24 and 33 each are the first partition walls; 41 is an ink tank; 42 is an ink chamber; 43 is an anilox roll; 44 is ink; 45 is a relief printing plate; 46 is a plate cylinder; 47 is a stage; 48 is a substrate; 51 is a blanket cylinder; 52 is a silicone blanket; 53 is an ink layer; 53a is an ink layer; 53b is an ink layer; 53c is an organic functional thin film; 54 is a relief printing plate; 54a is a convex part; 55 is a substrate; 61 is a substrate; 62 is a first electrode; 631 is a first partition wall; 631*a* is a first partition wall lower part; 631*b* is a first partition wall upper part; 632 is a second partition wall; 64 is an aperture; 65 is an organic luminescence media layer; 65*a* is a charge transport layer; 65*b* is an organic luminous layer; 81 is a printing plate (relief printing plate); 81*a* is a printing area (convex part); 81*b* is a non-printing area (concavity); 82 is a printing drum; 83 is a support medium; 84 is ink; 85 is a substrate; 91*a* is a printing area (convex part); 96 is a plate cylinder.

DESCRIPTION OF THE PREFERRED EMBODIMENTS

Printed matter of the present invention has a substrate, partition walls installed on substrate and organic functional thin film formed in area sectioned by partition walls. As such a printed matter, a color filter that organic functional thin film is the color filter layer, a biochip that organic functional thin film is organic compound separation layer and a circuit board or the TFT substrate that organic functional thin film is conductive material are exemplified.

Here, for purposes of example, the organic electroluminescent device that organic functional thin film is the organic luminescence media layers such as charge transport layer or organic luminous layer is explained.

Organic electroluminescent device 10 which is printed matter of the present invention has substrate 11, partition wall 13 installed on a substrate and organic luminescence media layer 14 which is formed in area sectioned by partition wall 13. (FIG. 1A)

Configuration of partition wall is configuration of a grating formed by the first partition wall which is parallel to a first straight line and the second partition wall which are parallel to a second straight line.

First electrode 12 is installed in the lower part of organic luminescence media layer. Second electrode 15 is installed in upside of organic luminescence media layer. Both electrodes sandwich the organic luminescence media layer.

Sealing body 16 is installed on second electrode 15 to protect organic luminescence media layer from external environment.

Organic luminescence media layer is formed by a printing method with the use of printing plate having printing area corresponding to the first partition wall.

Substrate

Substrate 11 is a support medium of printed matter of the present invention. (FIG. 1A) An insulating property substrate which is superior in dimensional stability can be used as a substrate.

For example, the following substrates can be used as a substrate:

1. glass, quartz, plastic film or sheet such as polypropylene, polyether sulfone, polycarbonate, cyclo olefin polymers, polyarylate, polyamide, polymethyl methacrylate, polyethylene terephthalate and polyethylenenaphthalate;

2. the translucency substrate which the plastics film or sheet is laminated by only monolayer or the plural layers comprised of the following material:

metallic oxide such as oxidation silicon and alumina;

metal fluoride such as aluminium fluoride and magnesium fluoride;

metal nitrides such as silicon nitride and aluminum nitride;

metal acid nitride such as oxynitriding silicon;

macromolecule resin film such as acrylic resin, epoxy resin, silicone oil and polyester resin;

metallic foil, sheet or board made of aluminium or stainless, and 3. the non-translucency substrate which the plastic film or sheet is laminated by metal membrane such as aluminium, copper, nickel and stainless.

Depending on the direction which light comes out, translucency of substrate is selected.

It is necessary for substrate comprising these materials to avoid entry of moisture to organic electroluminescent device. By way of example only, inorganic film is formed on a substrate. Or fluorocarbon resin is applied to a substrate. It is desirable that exclusion of moisture and hydrophobic processing of a substrate are performed in this way. Particularly it is desirable to lower moisture content in a substrate and gas transmission coefficient to avoid entry of moisture to organic luminescence media.

In addition, as these substrates, the driving substrate that thin film transistor (TFT) is formed may be used if necessary. (FIG. 1B)

In the case that a printed matter of the present invention is used as the organic electroluminescent device substrate of active driving type, planarizing layer 117 can be formed on TFT 120. A bottom electrode (the first electrode 2) of an organic electroluminescent device can be on planarizing layer 117. And, by means of contact hole 118 in planarizing layer 117, a bottom electrode should be electrically connected to TFT. By reason of such a configuration, TFT is sufficiently electrical insulation state with organic electroluminescent device.

TFT 120 and the upward organic electroluminescent device are supported with support medium 111. It is desirable for mechanical intensity of support medium 111 to be high. In addition, it is desirable for dimensional stability of support medium 111 to be high. Material for the substrate can be used as material of support medium 111.

For thin film transistor 120 on support medium 111, well-known thin film transistor can be used. By way of example only, thin film transistor having the active layer that a source/drain region and a channel area are formed, the gate insulator and the gate electrode is exemplified. Configuration of thin film transistor is not limited to this configuration. By way of example only, staggered type, reverse staggered type, top gate type and coplanar type are exemplified.

Active layer 112 can encompass many embodiments. By way of example only, it can be formed by inorganic semiconductor material such as amorphous Si, polycrystalline silicon, crystallite Si, cadmium selenide or organic semiconductor material such as thiophene oligomer, and poly (phenylene vinylene).

A manufacturing method of these active layers is exemplified below:

Method to do ion doping after laminating by plasma CVD technique of amorphous silicon. Can comprise the following processes: Formation of amorphous silicon by LPCVD method with the use of $SiH_4$ gas; Formation of a polySi by crystallization of amorphous silicon by solid phase epitaxy; and Ion doping by ion implantation method.

Method (low temperature processing) comprising the following processes: Formation of amorphous silicon by LPCVD method with the use of $Si_2H_6$ gas (or formation of amorphous silicon by PECVD method with the use of $SiH_4$ gas.); Annealing by laser such as excimer laser; Formation of a polySi by crystallization of amorphous silicon; and Ion doping by ion doping method.

Method (high temperature processing) comprising the following processes: Laminating of a polySi by low pressure CVD method or LPCVD method; Formation of gate insulator by thermal oxidation more than 1,000 degrees Celsius; Formation of gate electrode 114 of an n+ polySi to the top; and Ion doping by ion implantation method.

For gate insulator 113, conventional gate insulator can be used. By way of example only, $SiO_2$ formed by PECVD method or LPCVD method, $SiO_2$ provided by thermal oxidation of polysilicon film can be used.

For gate electrode 114, conventional gate electrode can be used. Metal such as aluminum, copper, refractory metal such as titanium, tantalum and tungsten, a polySi, silicide of refractory metal, or polycide can be used.

For thin film transistor 120, a single gate structure, a double gate structure, multiple gating configuration having gate electrodes more than three gate electrodes are exemplified. In addition, even LDD configuration and offset configuration are preferable. Even more particularly, thin film transistors more than two thin film transistors may be placed on one pixel.

As for the display unit of the present invention, thin film transistor has to function as a switching element of organic electroluminescent device. Drain electrode 116 of transistor and pixel electrode (the first electrode 2) of organic electroluminescent device are connected electrically. Even more particularly, generally, for pixel electrode (the first electrode 2) for top emission configuration, it is necessary for metal reflecting back light to be used.

Drain electrode 116 of thin film transistor 120 is connected with pixel electrode (the first electrode 2) of organic electroluminescent device by electric wiring. This electric wiring is formed in contact hole 118 penetrating through flattening membrane 117.

Material of flattening membrane 117 is exemplified below. Inorganic materials such as $SiO_2$, spin-on-glass, SiN ($Si_3N_4$) and TaO ($Ta_2O_5$), organic materials such as polyimide resin, acrylic resin, photoresist material, and black matrix material can be used. Manufacturing methods such as spin coating, CVD and evaporation method can be selected depending on these materials. If necessary, a photosensitive resin is used as a planarizing layer 117, and contact hole 118 is formed by procedure of photolithography in position corresponding to thin film transistor 120. Or after having formed a planarizing layer on the entire surface, contact hole 118 is formed by dry etching or wet etching in position corresponding to thin film transistor 120. Contact hole 118 is buried by conductive material. Then contact hole is connected with pixel electrode electrically. A planarizing layer 117 should be able to cover up lower TFT, capacitor and electric wiring. So thickness of a planarizing layer should be several μm (for example 3 μm).

Cross figure of an example of the substrate which can be used for substrate 11 for active matrix driving type organic electroluminescent device is shown in FIG. 1B.

First Electrode

First electrode 12 is layered on substrate 11. Patterning of first electrode 12 is performed if necessary. (FIG. 1A)

According to the present invention, first electrode is pixel electrode corresponding to each pixel by sectioning of first electrode by the first partition wall and the second partition wall.

Material of first electrode is described below:

metal complex oxide such as ITO (indium tin complex oxide), indium zinc complex oxide or zinc aluminium complex oxide;

metallic substances such as gold, platinum and chromium; and the particle dispersion membrane which finely divided particles of the metallic oxide or the metallic substance is dispersed in epoxy resin or acrylic resin.

A single-layered body or a laminated material of the above described material can be used.

When first electrode is anode, it is desirable to select the material such as ITO that work function is high. In the case of so-called bottom emission configuration, it is necessary to select material with translucency as material of first electrode.

Metallic substances such as copper or aluminium may be added as a supporting electrode to make electric wiring electrical resistance of first electrode small if necessary.

For a formation method of first electrode, the following methods can be used depending on material:

dry method such as resistance heating evaporation method, electron-beam evaporation technique, reactivity evaporation method, ion plating method and sputtering method; and wet method such as the gravure process and screen printing.

For a patterning method of first electrode, material and a film formation method are depended upon, and existing patterning method such as mask evaporation method, photolithography method, wet etching method, dry etching method can be used.

It is formed a lower pixel is corresponded to when the material which formed TFT as a substrate is used, and to be able to plan continuity.

Partition Wall

Partition wall 13 of the present invention is formed to section a light emitting area corresponding to a pixel. In the case that a substrate has first electrode 12, it is preferable for partition wall 13 to cover an end of first electrode (FIGS. 1A, 1B).

Partition wall consists of the first partition wall 24, 33 which is parallel to a first straight line and the second partition wall 23, 32 which is parallel to a second straight line.

The first partition wall and the second partition wall are crossing, so configuration of partition wall is configuration of a grating (FIG. 2, FIG. 3).

The first straight line 100 and the second straight line 200 correspond to direction of movement of printing plate and substrate, and to their patterns. The first straight line 100 and the second straight line 200 are the aerial straight lines which are provided for convenience. The first straight line 100 is usually perpendicular to the second straight line 200. According to the present invention, printing area of printing plate for printing of organic functional thin film is formed so that the printing area corresponds to only the first partition wall. And, on the occasion of printing, printing area of printing plate gets over the second partition wall. Height, width and formation method of the first partition wall may be same as those of the second partition wall.

By way of example only, the first partition wall and the second partition wall can be formed at the same time. However, configuration of the second partition wall should be harder to affect printing than configuration of the first partition wall. By way of example only, the second partition wall can be lower than the first partition wall. Or width of the second partition wall can be smaller than width of the first partition wall. Or the second partition wall may not have liquid repellent characteristic.

For a formation method of partition wall of lattice shape, the following conventional method can be used:

1. Inorganic film is uniformly formed on substrate, this substrate is masked with resist, and dry etching of inorganic film is performed; or 2. A photosensitive resin is laminated on substrate, and predetermined pattern is formed by a photolithography method.

Water-repellent may be added if necessary. By means of irradiating plasma or UV on partition wall after the formation of partition wall, partition wall can be ink repellent. When height of the second partition wall is the same as height of the first partition wall, this method can be applied. This method can be also applied to the case that width of the second partition wall is narrower than width of the first partition wall.

Example of a formation method of partition wall in the case that height of the second partition wall is lower than height of the first partition wall is described below.

Inorganic film made of $SiO_2$ of which thickness is 0.5 μm is laminated on substrate by CVD method. An aperture corresponding to a light emitting area is formed by dry etching method. Inorganic partition wall of the lattice shape which is the second partition wall and the first partition wall lower part is formed in this way.

A photosensitive resin of which thickness is 0.8 μm is laminated by means of slit coat method next. By means of exposure/development process, the first partition wall upper part of which shape is stripe shape is formed on the first partition wall lower part.

A set of the first partition wall upper part and the first partition wall lower part is the first partition wall.

A photosensitive resin may be liquid repellent.

It is preferable for height of partition wall to be 0.1 μm-10 μm.

When height of the first partition wall is equal to height of the second partition wall, it is desirable that height of partition wall is 0.5 μm-2 μm. When height of the second partition wall is lower than height of the first partition wall, it is desirable that height of the first partition wall is 1 μm-5 μm, and it is desirable that height of the second partition wall is 0.5 μm-2 μm.

In addition, it is desirable that width of partition wall is 3 μm-50 μm when width of the first partition wall is equal to width of the second partition wall. When width of the second partition wall is narrower than width of the first partition wall, it is desirable that width of the first partition wall is 5 μm-100 μm, and it is desirable that width of the second partition wall is 5 μm-50 μm.

When width of partition wall is too large, aperture becomes small. Therefore the second partition wall should be formed in a forward tapered shape, or, the angle of the second partition wall should be rounded off. Then the first partition wall does not invade a light emitting area, and, in addition, width of the partition wall upper part becomes small.

As configuration of partition wall, even configuration except configuration of a straight line illustrated is preferable. An intersection part of the first partition wall and the second partition wall can be rounded to a direction of light emitting area in order to fill aperture by ink easily.

In addition, one part of the second partition wall can be thinned.

In addition, one part of the second partition wall can be lower.

Organic Luminescence Media Layer

Organic luminescence media layer 14 is formed next (FIG. 1A).

For organic luminescence media layer 14 in the present invention, it can be formed with a single layer film or multilayer films including luminescent material.

Constitutional example in case of multilayer films is described below:

two layers constitution comprising hole transport layer and electron transport property luminous layer, or hole transport-related luminous layer and electron transport layer; and three layers constitution comprising hole transport layer, luminous layer and electron transport layer.

Besides, function of hole (electron) injection and function of hole (electron) transportation may be separated if necessary. The layer which blocks transportation of hole (electron) may be inserted.

In addition, an organic luminescence layer in this specification means a layer including organic luminescent material, and a charge transport layer such as a hole transport layer means a layer which is formed in order to improve luminous efficiency of other layer.

Representative examples of a hole transport material, comprising a hole transport layer, include copper phthalocyanine, Metallophthalocyanine such as tetra(t-butyl) copper phthalocyanine, Metal-free phthalocyanine, Quinacridon chemical compound, aromatic amine type low molecular hole injection transportation material such as N,N'-di(1-naphthyl)-N,N'-diphenyl-1,1'-biphenyl-4,4'-diamine, 1,1-bis(4-di-p-tolylamino phenyl)cyclohexane, N,N'-diphenyl-N,N'-bis(3-methylphenyl)-1,1'-biphenyl-4,4'-diamine, macromolecule hole transport materials such as polyaniline (PANI), polythiophene, polyvinylcarbazole, mixture with poly (3,4-ethylenedioxy thiophene) (PEDOT) and polystyrene sulfonate, polythiophene oligomer material, and other existing hole transport materials.

The organic luminescent material can include low molecular type organic luminescent material and high molecular form organic luminescent material. Representative embodiments of luminescent materials include the following:

9,10-diaryl anthracenes, pyrene, coronene, perylene, rubrene, 1,1,4,4-tetra phenylbutadiene, tris(8-quinolinolate) aluminium complex, tris (4-carbinyl-8-quinolinolate)aluminium complex, bis(8-quinolinolate)zinc complex, tris(4-carbinyl-5-trifluoromethyl-8-quinolinolate)aluminium complex, tris(4-carbinyl-5-cyano-8-quinolinolate)aluminium complex, bis(2-carbinyl-5-trifluoromethyl-8-quinolinolate)[4-(4-cyanophenyl)phenolate]aluminium complex, bis(2-carbinyl-5-cyano-8-quinolinolate)[4-(4-cyanophenyl)phenolate]aluminium complex, tris(8-quinolinolate)scandium complex, bis[8-(para-tosyl)aminoquinoline]zinc complex and cadmium complex, 1,2,3,4-tetraphenylcyclopentadiene, the pentaphenyl cyclopentadiene, poly-2,5-diheptyloxi-para-phenylenevinylene, chroma phosphorus type fluorescent substance, the perylene type fluorescent substance, the pyran type fluorescent substance, the anthrone type fluorescent substance, the porphyrin type fluorescent substance, the quinacridon type fluorescent substance, N,N'-dialkyl displacement quinacridon type fluorescent substance, the naphthalimido type fluorescent substance, N,N'-diaryl displacement pyrrolo pyrrole series fluorescent substance, low molecular system luminescent material such as phosphorescence fluor such as Ir chelate, high polymer materials such as poly arylene type, poly arylenevinylene type, poly fluorene, polyparaphenylene vinylene, polythiophene, police pyro, the material which the low molecular material is dispersed in these high polymer materials, or the material which inter-polymerization of the low molecular material with these high polymer materials was done, the material which low molecular system luminescent material is scattered in high polymer materials such as polystyrene, polymethyl methacrylate, polyvinylcarbazole, existing macromolecule/low molecular luminescent material.

Representative examples of an electron transport material include 2-(4-biphenyl)-5-(4-t-butylphenyl)1,3,4-oxadiazole, 2,5-bis(1-naphthyl)-1,3,4-oxadiazole, Oxadiazoles, Bis(10-hydroxybenzo[h]quinolinate)beryllium complex, Triazole compound, and combinations thereof As is understood by one having ordinary skill in the art, a vacuum deposition can be for the deposition of these materials.

Film thickness of organic luminous media layer can be lower than 1,000 nm whether organic luminous media layer is single or plural layer(s), and preferably it is 50-150 nm.

As for the hole transport material of an organic electroluminescent device, covering of the surface protrusions of the substrate and first electrode is particularly important. Therefore, it is preferable to form a film of around 50-100 nm.

For a formation method of organic luminescence media layer 14, depending on the material comprising each layer, the following method can be used:

vacuum evaporation; coating methods or printing methods such as spin coat, spray coat, flexo, gravure, microgravure and intaglio offset; and ink jet method.

When solution of material comprising the organic luminescence media layer is made, depending on the formation method, it is desirable to control vapor pressure, solids content rate and viscosity of solvent.

For solvent, water, dimethylbenzene, anisole, cyclohexanone, mesitylene, tetralin, cyclohexylbenzene, methyl benzoate, ethyl benzoate, toluene, ethanol, acetone, methyl ethyl ketone, methyl isobutyl ketone, methanol, isopropyl alcohol, ethyl acetate and butyl acetate can be used. Even mixed solvent comprising these materials is preferable.

In addition, to improve coating performance, it is preferred to mix an appropriate amount of additive such as detergent, antioxidant, viscosity modifier and UV absorber with the solution if necessary.

A drying method of application liquid is explained below.

Solvent is removed from application liquid not to influence luminescence property. As a method to remove solvent, removing by heating, removing under reduced pressure and removing by heating under reduced pressure can be used.

According to the present invention, at least one layer among the layers which comprises organic luminescence media layer 14 is formed by a printing method.

Separated color parts are necessary so that organic electroluminescent device displays a color. Therefore, organic luminous layer is preferable as the layer which is formed by a printing method.

In addition, when charge transport layer is formed on partition wall, electric current leak may occur. Therefore, a printing method can be preferably used for the formation of charge transport layer, too. When a charge transport material is changed depending on the characteristic of each color luminescent material, this method can be adapted preferably.

When all layers which comprise the organic luminescence media layer are formed by a printing method of the present invention, manufacturing process can be very simplified.

Formation of Organic Functional Thin Film

Organic functional thin film included by printed matter of the present invention is formed by a printing method.

For the printing method that can be used for the present invention, relief printing, gravure printing and planographic (offset) printing can be exemplified.

It is often that glass and plastic film are used as the substrate on which organic functional thin film is formed. These substrates are easy to be broken by local pressure. So, in printing to these substrates, printing plate or blanket close against a substrate should be resin such as rubber.

Offset printing or relief printing which surface of blanket or printing plate touching the substrate is made of resin such as rubber can be adopted.

Above all, type using printing plate made of resin or rubber can be selected.

When offset printing is used, the inversion offset method how thin film is formed uniformly is desirable.

Relief Printing Method

For relief printing plate used for the formation of organic functional thin film, water development type plastic plate is desirable. For a water development type photosensitive resin comprising such a resin printing plate, the type that hydrophilic polymer, monomer including unsaturated bonding so-called cross-linkable monomer and photoinitiator are component can be used. In this type, polyamide, polyvinyl alcohol and cellulose derivative are used as hydrophilic polymer. In addition, for example, methacrylate having vinyl bonding is used as cross-linkable monomer. For example, aromatic carbonyl compound is used as photoinitiator. Above all, a polyamide-based water development type photosensitive resin is preferred from an aspect of printability.

As a printer for the formation of organic functional thin film, relief printing machine for printing to flat plate can be used. By way of example only, printer as shown in the following is desirable.

Figure 4:
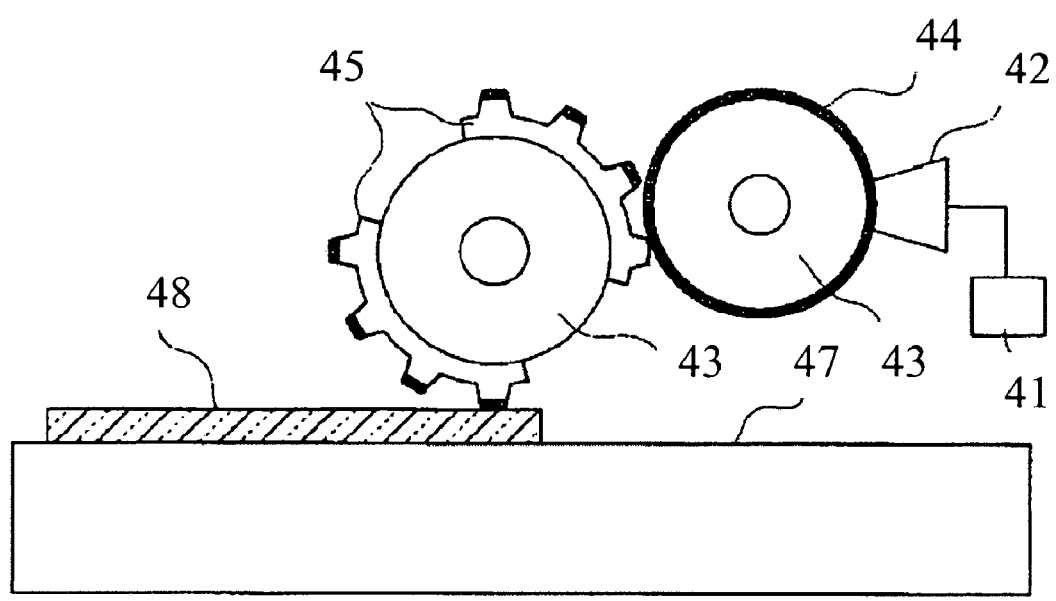
FIG. 4 shows a schematic view explaining an example of the printing process that can be used with the present invention.

A schematic illustration of printer is shown in FIG. 4. This manufacturing apparatus has ink tank 41, ink chamber 42, anilox roll 43 and plate cylinder 46 which plastic plate 45 was attached to.

Organic functional ink diluted with solvent is accommodated in ink tank 41. Organic functional ink is sent into ink chamber 42 from ink tank 41. Anilox roll 43 rotates close against an ink supply of ink chamber 42 and plate cylinder 46.

Organic functional ink 44 supplied from ink chamber is held uniformly on anilox roll surface by rotation of anilox roll 43. Then, the organic functional ink on anilox roll surface is transferred with uniformity on a convex part of plastic plate attached on a plate cylinder. Substrate 48 is fixed on a substrate fixing stage which is slidable (stage 47). While a positioning mechanism between printing plate pattern and a substrate pattern is positioning substrate 48, substrate 48 is moved to a printing staring point. Even more particularly, while a convex part of plastic plate is close against a substrate, plastic plate moves in correspondence with rotation of a plate cylinder. Pattern-shaped ink is transferred in predetermined position of a substrate.

Inversion Offset Printing

An example of an inversion offset printer which can be applied to the formation of organic functional thin film is shown in FIG. 5 typically.

Inversion offset printer has a blanket which supports an ink layer, an ink supply (not shown in figures) which supplies an ink on the blanket and a relief printing plate which removes an uselessness part of the ink layer on the blanket.

In addition, a substrate is placed on the stage which is under a blanket. A substrate is moved in accordance with printing speed.

Blanket comprises blanket cylinder 51 and silicone blanket 52 wound around blanket cylinder 51.

Ink for ink layer 53 is applied to effective surface of the silicone blanket installed in a blanket cylinder by the ink feed means that is not illustrated.

Figure 5A:
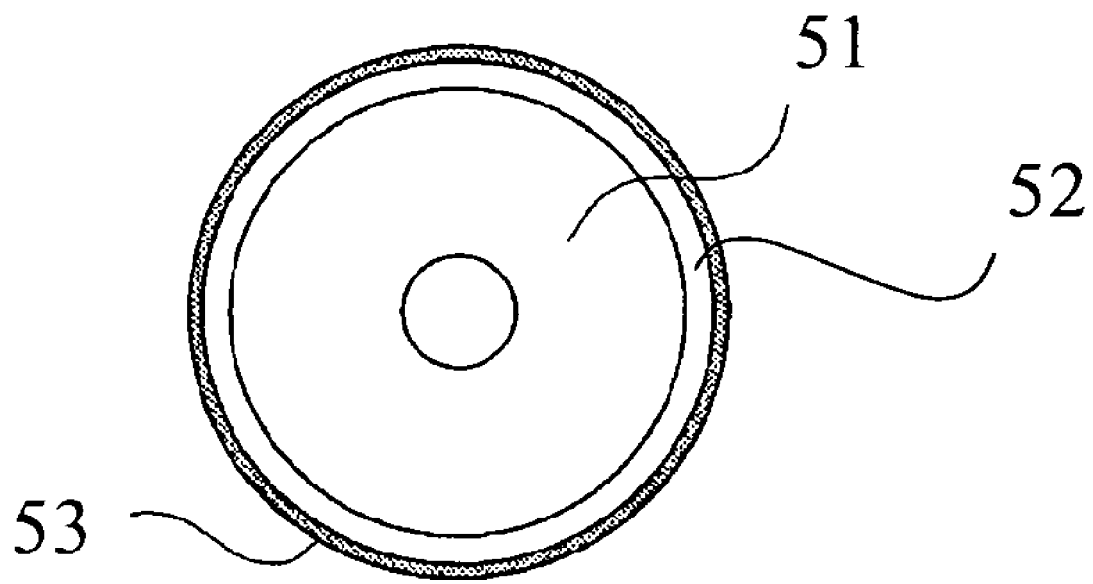

Ink layer 53 is formed by drying ink for ink layer 53 (FIG. 5A).

Figure 5C:
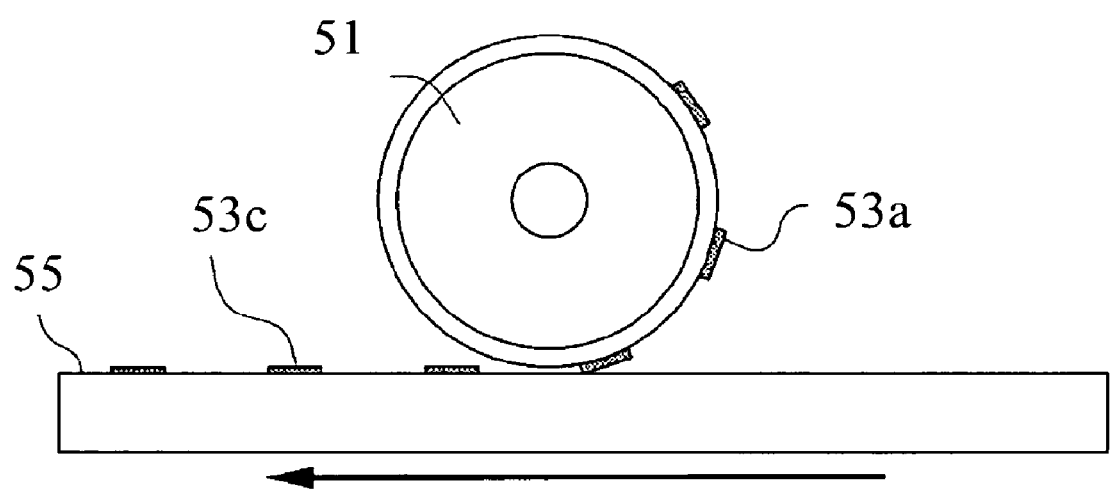

Subsequently blanket cylinder 51 rotates. Relief printing plate 54 that negative pattern (non-printing area) is formed is attached to silicone blanket 52 by pressure. The stage that relief printing plate is fixed moves in accordance with rotation of a blanket cylinder. At this time, ink layer 53b which is attached by pressure to convex part 54a of relief printing plate is removed from blanket, and this part of the ink layer 53b is transferred to a convex part of relief printing plate. Desired pattern 53a of an ink layer is formed on blanket (FIG. 5B). Blanket cylinder 51 rotates next. Substrate 55 attaches by pressure to silicone blanket 52. The stage on which a substrate is fixed moves in accordance with rotation of a blanket cylinder. At this time, pattern-shaped ink layer 53a on silicone blanket is transferred to a substrate (FIG. 5C).

Second Electrode

Second electrode 15 can be formed next as illustrated by FIG. 1A. When second electrode is cathode, the material discussed below can be used.

The material can be of a type with high electron injection efficiency to an organic luminescent media layer 14 and low work function.

In some embodiments, second electrode 15 can include a metal such as Mg, Al, Yb and combination of the same.

In addition, the following layer stack may be put in a boundary surface of the luminescent medium. The layer stack is that with chemical compound of about 1 nm thicknesses such as Li and oxidation Li, LiF and Al and Cu of stability and/or high conductivity. Stability should be balanced with electron injection efficiency. Therefore an alloy system may be used. Alloy of more than one kind of metal such as Li, Mg, Ca, Sr, La, Ce, Er, Eu, Sc, Y, and Yb that have a low work function, and metallic element such as Ag, Al, and Cu which are stable can be used. In some embodiments, alloy such as MgAg, AlLi, and CuLi can be used.

It is desirable to select a material having translucency in so-called top emission construction so as to allow visible radiation to come out of the second electrode side. In this case, Li and Ca of a low work function are provided with thin measurements. Metal complex oxide such as ITO (indium tin complex oxide) and indium zinc complex oxide, zinc aluminium complex oxide may be laminated thereafter. In addition, a little metal doping such as Li and Ca of a low work function can be performed to organic luminous media layer 4, and metal compound such as ITO may be laminated.

Depending on the material, for the formation of the second electrode, methods such as resistance heat coating by vaporization, electron beam evaporation, reactive deposition, ion plating and sputtering can be used.

For the second electrode, thickness of about 10 nm-1,000 nm is desirable.

In addition, when second electrode is translucency electrode layer and is made of metallic substances such as Ca or Li, it is desirable for the thickness of second electrode to be 0.1-10 nm.

Sealing Body

As organic electroluminescent device, organic luminous layer is sandwiched between electrodes, and it can emit light by applied electric current. However, organic luminous layer deteriorates easily by means of atmospheric moisture and oxygen. Thus a seal to intercept organic luminous layer and the like from the outside is usually provided.

A sealing body is explained below.

By way of example only, the substrate that the first electrode, the organic luminescent media layer including organic luminous layer and the second electrode are formed is prepared. Resin layer 16b is provided over a sealing medium 16a. A sealing medium 16a is stuck on the substrate by means of resin layer 16b.

For a sealing medium 16a, it is necessary for transmissivity of moisture and oxygen to be low.

In addition, as an example of material of the sealing medium, ceramics such as alumina, silicon nitride and boron nitride, glass such as no-alkali glass and alkali glass, quartz, metallic foil such as aluminium and stainless, and humidity resistance film are exemplified.

By way of example only, the following humidity resistance film is exemplified:

the film which is formed SiOx by CVD method on both sides of a plastic substrate; the film which laminated the film that transmissivity of moisture and oxygen is small and hydrophilic film; and the film which water absorption agent is applied on a film that transmissivity of moisture and oxygen is small.

It is preferable for water vapor permeation rate of the humidity resistance film to be less than $10^{-6}$ g/m$^2$/day.

For example, for resin layer 16b, the following materials can be used:

A photo-curing adhesive property resin, a heat curing adhesive property resin, 2 fluid hardening adhesive property resin comprising an epoxy type resin, acrylic resin, silicone oil and the like, acrylic resin such as ethylene ethylacrylate (EEA) polymer, vinyl resins such as ethylene vinyl acetate (EVA), thermoplastic resin such as polyamide, a synthetic rubber, thermoplasticity adhesive property resins such as acid denatured substances of polyethylen or polypropylene.

An example of method to form resin layer on a sealing medium is shown below:

solvent solution method, pushing out laminate method, fusion/hot melt method, calender method, discharge jet application method, screen printing, vacuum laminate method and heated roll laminate method.

A material having hygroscopicity and a property to absorb oxygen can be incorporated into adhesive if necessary.

Depending on size and configuration of sealed organic electroluminescent display unit, thickness of resin layer installed in a sealing medium is fixed. As for the thickness of resin layer, about 5-500 μm are desirable.

In a sealing room, a substrate with the first electrode, the organic luminous media layer including organic luminous layer and the second electrode is affixed to a sealing body 16.

When it is two layers construction consisting of a sealing medium and resin layer of thermoplastic resin, contact bonding should be performed only by heating roller.

In the case of a heat curing type adhesive resin, it attaches by pressure by heating roller. And a heat curing type adhesive resin is heated, and is hardened.

At first, in the case of a photo-curing-related adhesive resin, it is sealed by pressure by roller. And a photo-curing-related adhesive resin is stiffened by irradiating a light.

In addition, in the above described example, resin layer may be formed-on a sealing medium. However, after having formed resin layer on a substrate, it may be stuck with a sealing medium.

Before sealing by means of a sealing body, inorganic thin film may be formed. By way of example only, as passivation film, silicon-nitride film of which film thickness is 150 nm is formed by CVD method. In addition, a sealing body consisting of inorganic thin film can be formed.

EXAMPLE 1

Figure 6B:
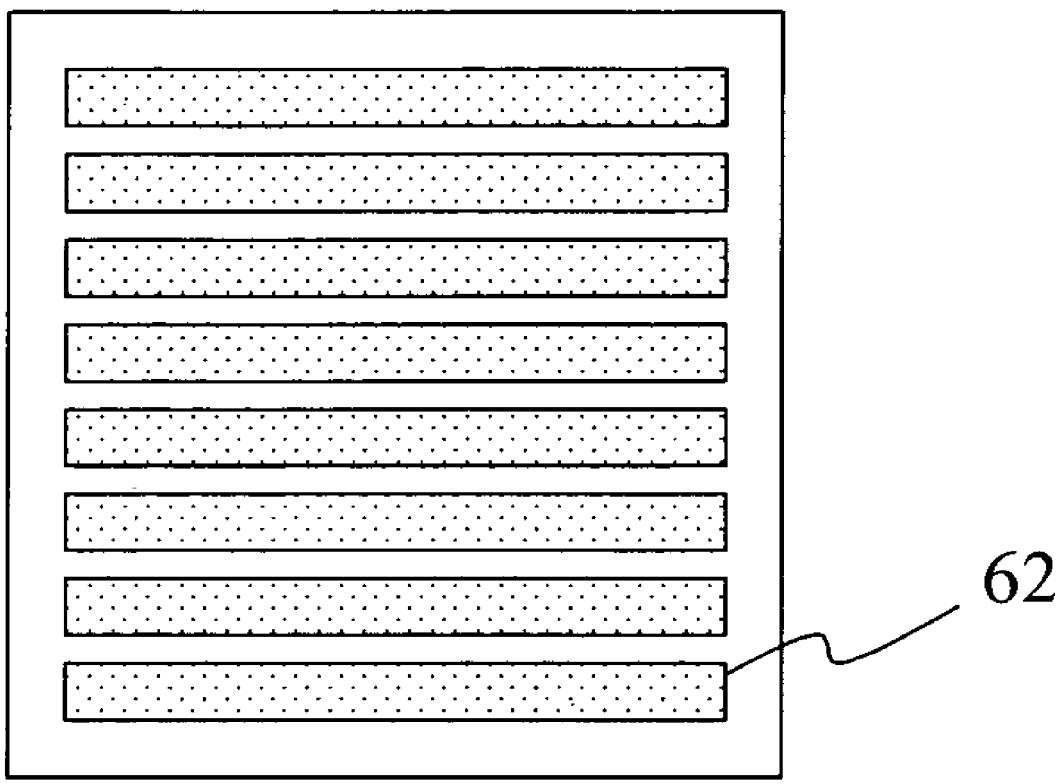
Figure 6C:
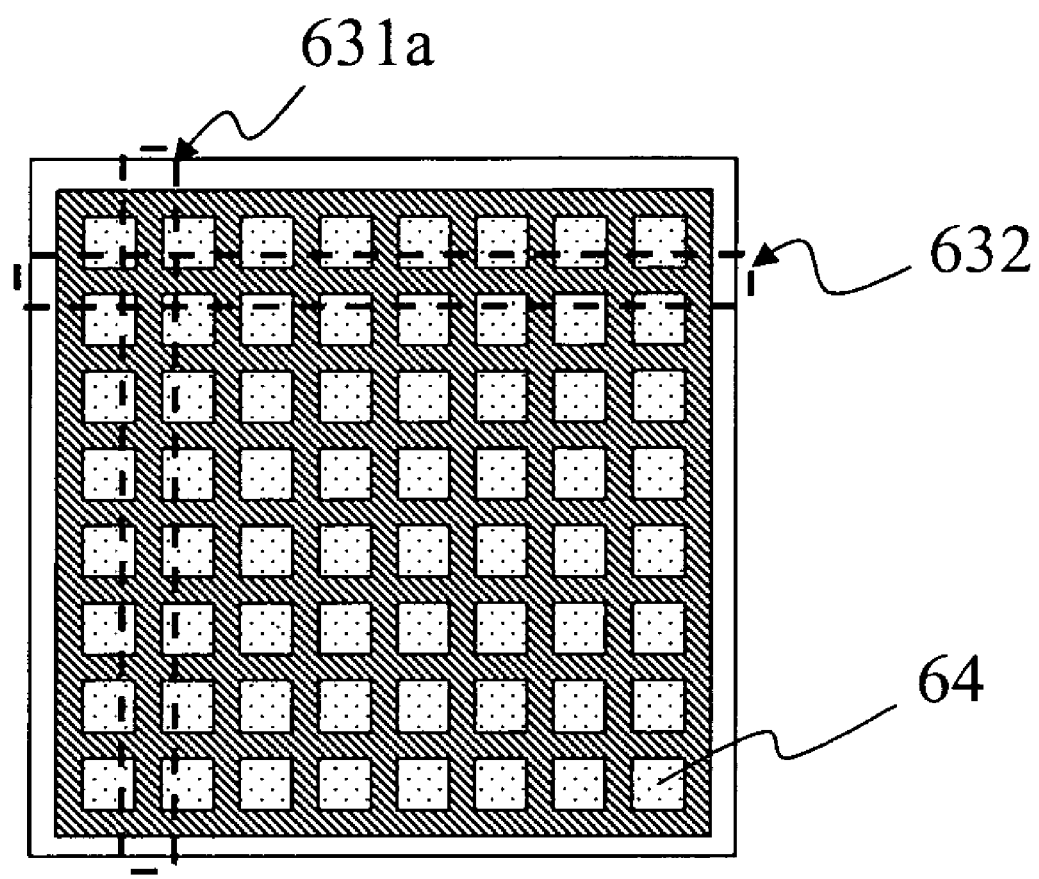

One embodiment of the invention is explained in FIG. 6 and FIG. 7.

A glass substrate of 10 cm square was used as substrate 61. It was decided that one side of this substrate 61 was the first straight line 100. It was decided that the side which was perpendicular to the first straight line 100 was the second straight line 200 (FIG. 6A).

As first electrode 62, sixty-four ITO stripe patterns which were parallel to the second straight line 200 were formed on this substrate 61 (FIG. 6B).

In addition, the figure is simplified, and only eight first electrodes are shown.

The $SiO_2$ film of which thickness was 0.5 μm was formed on substrate 61 by CVD method. Apertures corresponding to light emitting areas were formed by dry etching method. The inorganic partition wall of which configuration was a grating was formed in this way.

This inorganic partition wall consists of the second partition wall 632 and the first partition wall lower part 631a. The second partition wall 632 covers an end of the first electrode, and the second partition wall 632 is parallel to the second straight line 200. The first partition wall lower part 631a crosses across the first electrode, and the first partition wall lower part 631a is parallel to first straight line 100.

In addition, the figure is simplified, and only nine lines are shown.

By means of slit coat method, the photosensitivity polyimide resin of which thickness was 0.8 μm was formed next. By means of exposure/development of the photosensitive polyimide resin, the first partition wall upper part 631b of which shape was stripe shape was formed on upside of the first partition wall lower part 631a.

Figure 7A:
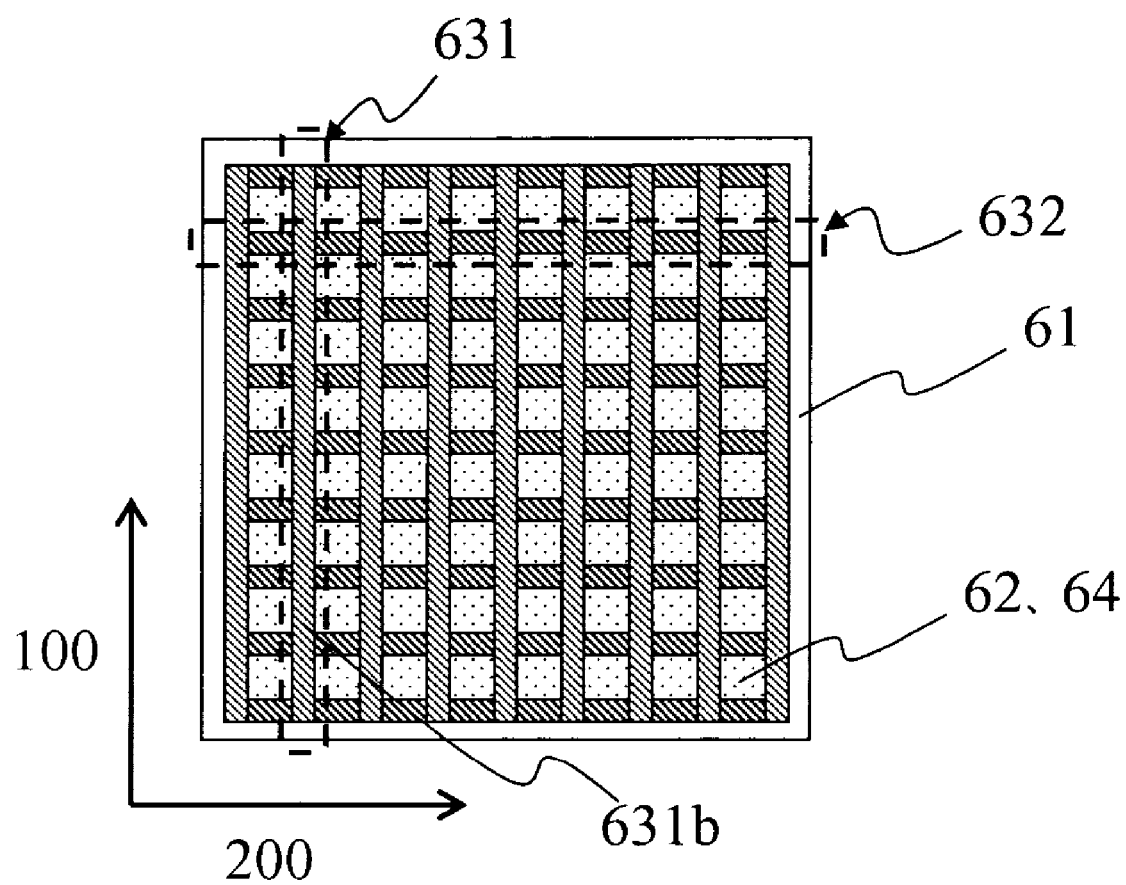
FIG. 7 is flow sheet which shows one embodiment of a manufacturing method of the present invention.

A set of the first partition wall upper part and the first partition wall lower part is the first partition wall 631 (FIG. 7A).

Surface treatment of first electrode was performed by means of $O_2$ plasma treatment. A liquid-repellent part of the first partition wall upper part comprising organic materials was formed by means of $CF_4$ plasma afterwards. Contact angle between the first partition wall upper part and ink for organic luminescence media layer which is described below is described below. Before liquid-repellent processing, the contact angle in the case of hole transport material was 80 degrees, and that in the case of organic luminescent material was 40 degrees. After liquid-repellent processing, the contact angles in the case of hole transport material and organic luminescent material were 120 degrees.

Figure 7B:
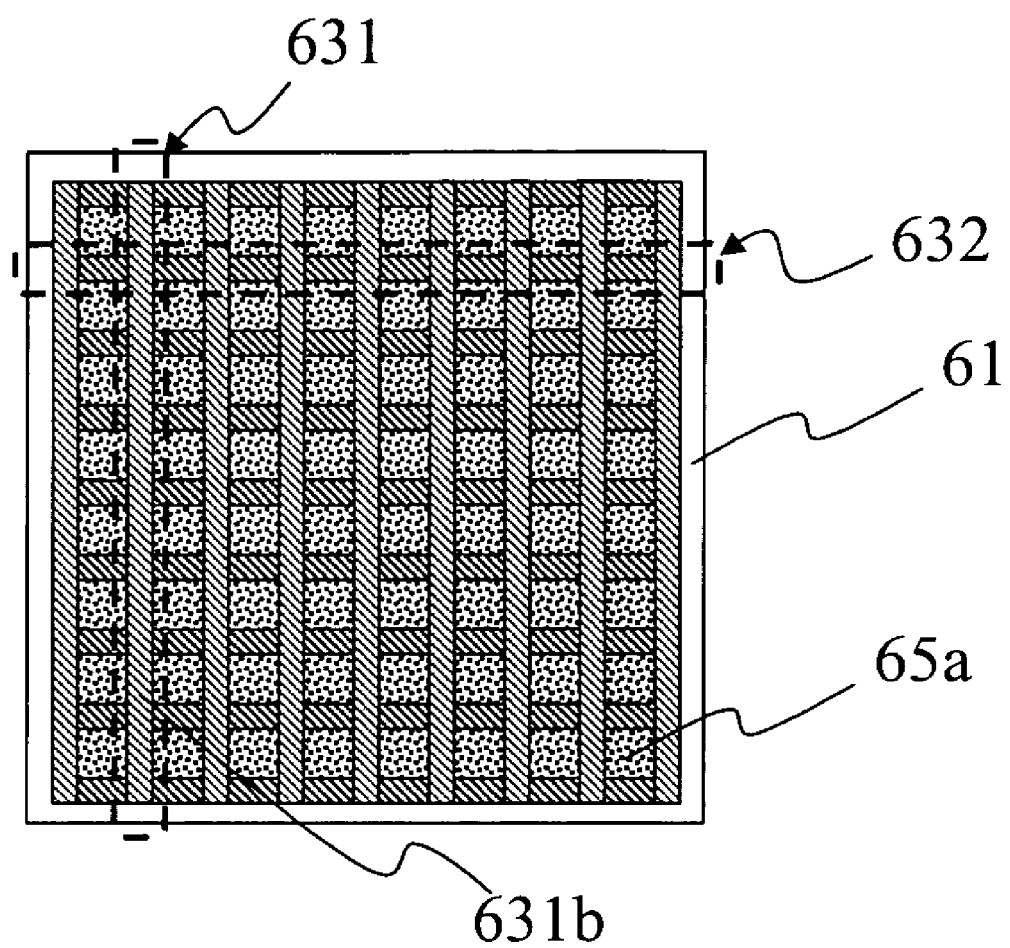

Macromolecule hole transport material ink was filled with aperture 64 sectioned by the first partition wall and the second partition wall by ink jet method. After drying process, charge transport layer 65a of which film thickness was 50 nm was formed (FIG. 7B).

A polythiophene derivative (PEDOT) was used as macromolecule hole transport material. This material was dispersed in water. Ink was made in this way.

Figure 7C:
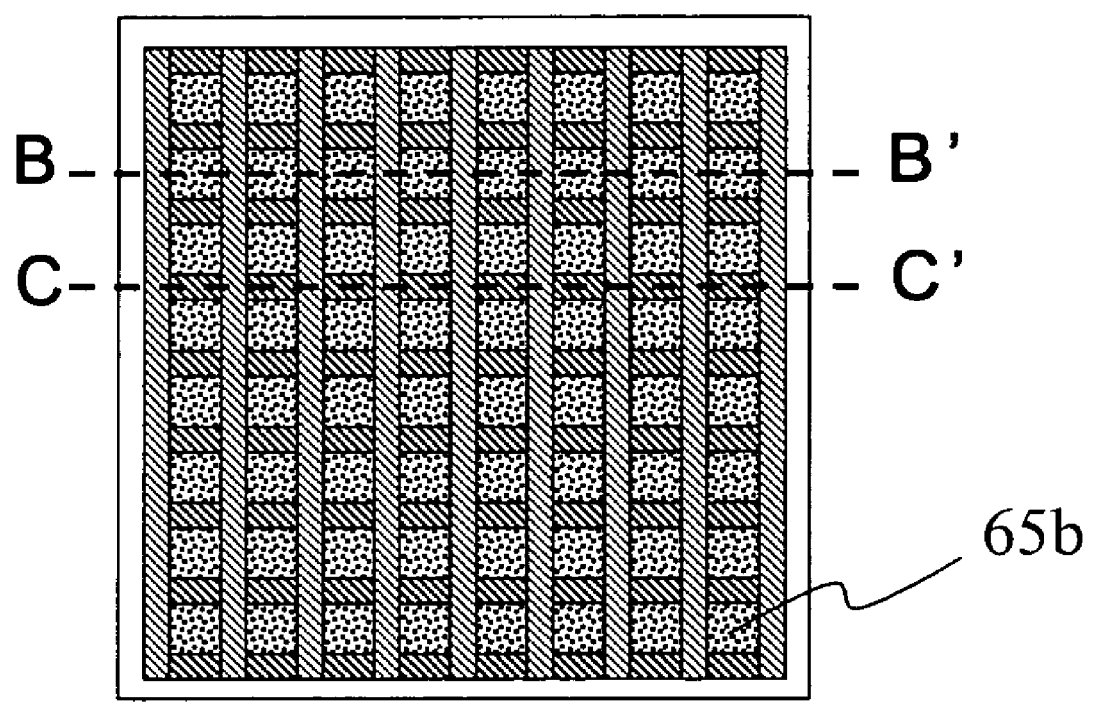

Subsequently organic luminous layer 65b of which thickness was 80 nm was formed on charge transport layer 65a. Combination of organic luminous layer and charge transport layer was organic luminescence media layer 65 (FIG. 7C).

A formation method of organic luminous layer is described below.

As organic luminescent material, the poly fluorene material which was macromolecule luminescent material was used. Poly fluorene material was dissolved in toluene. Ink was made in this way. This ink was printed by relief printing with the use of printing plate made of polyamide-based water development type photosensitive resin.

FIG. 8 is a schematic view that organic luminous layer is printed by means of relief printing method.

A relief printing plate which is printing plate 81 has convex part that is stripe-shaped printing area 81a corresponding to the first partition wall. After inking to relief printing plate, alignment of relief printing plate and the first partition wall 631 was performed. Printing was performed afterwards.

Printing plate 81 of which printing area 81a corresponding to the first partition wall was formed was set so that curve direction of printing drum 82 correspond to the first partition wall direction (the first straight line direction 100 in other words).

In addition, the substrate comprising partition wall was set on relief duplicator so that the first partition wall direction corresponds to printing direction.

Figure 8A:
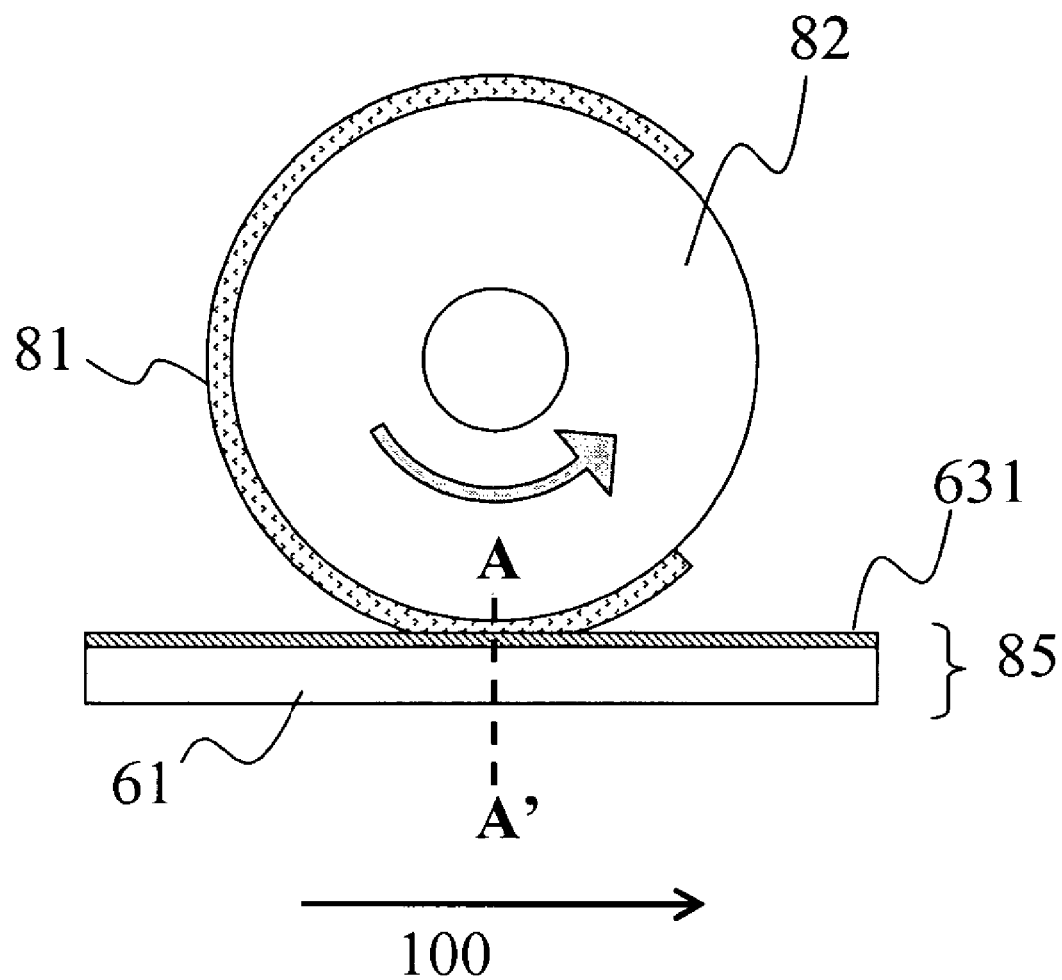
FIGS. 8A and 8B are explanatory drawings which show one embodiment of a manufacturing method of the present invention.
Figure 8B:
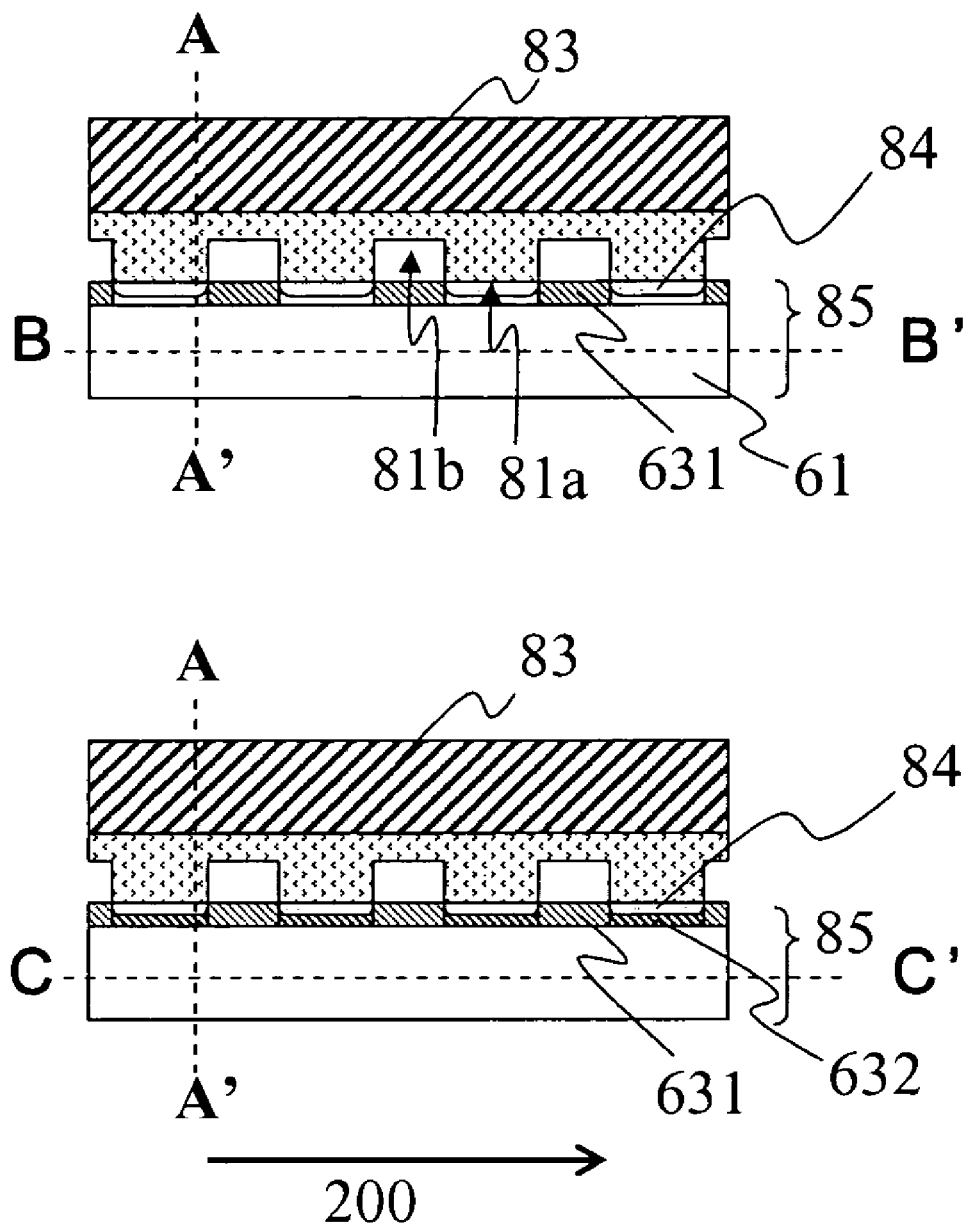

FIG. 8B is cross-section view of FIG. 8A along the line A-A'. In addition, FIG. 8B is cross-section view of FIG. 7C along the line B-B' or along the line C-C'.

Printing area 81a of relief printing plate gets over the second partition wall 632. And printing is performed.

The second partition wall is lower in comparison with the first partition wall 631. Therefore, influence of the second partition wall on printing plate 81 is small. Therefore, distance between printing plate 81 and substrate 85 can be shortened. Therefore, the phenomenon that ink remained on printing plate was able to be controlled. In addition, ink on printing area 81a was cut by means of the second partition wall 632 naturally. Therefore, ink did not remain on partition wall.

Alignment of the second straight line direction 200 was not necessary in the process of the present invention. Therefore, shortening of manufacturing process can be planned. In addition, yield of printed matter improves.

Second electrode was formed by laminating Ba of 5 nm thickness and Al of 100 nm thickness by evaporation method on the organic luminescence media layer which was formed by relief printing.

A passive matrix driving type organic luminescence Electroluminescent device of which pixel number was 4096 was formed in this way was sealed in glass cap.

First electrode was used as anode, and second electrode was used as cathode. Organic electroluminescent device emitted light. Luminescence was observed from the first electrode side. Luminescence unevenness was equal to or less than 5%.

Luminescence unevenness is defined by equation described below.

$$\text{Luminescence unevenness (\%)} = (L\max + L\min) / ((L\max + L\min)/2) * 100.$$

(Lmax: Maximum luminance in light emitting areas of an organic electroluminescence element which is emitting light.

Lmin: The minimum luminance in light emitting areas of an organic electroluminescence element which is emitting light.)

EXAMPLE 2

Substrate was prepared same as example 1. Inorganic partition wall was not formed. By slit coat method same as example 1, the photosensitivity polyimide resin of which thickness was 1.2 μm was formed. By exposure/development, apertures corresponding to light emitting areas were formed. Organic partition wall of lattice shape was formed.

This organic partition wall includes the second partition wall which covers an end of the first electrode formed earlier and is parallel to the second straight line, and the first partition wall which is form of sixty-five lines and crosses over the first electrode.

The width of the first partition wall and the second partition wall was 40 μm equally.

Same as example 1, after surface treatment of the first electrode by $O_2$ plasma treatment was performed, liquid-repellent processing of the first partition wall upper part comprising organic materials was performed.

Macromolecule hole transport material ink adjusted same as example 1 was placed at the aperture that was domain sectioned by the first partition wall and the second partition wall.

The ink was dried, and a charge transport layer of film thickness 50 nm was formed.

Subsequently macromolecule luminescent material ink adjusted same as example 1 was applied. This ink was dried. The organic luminous layer of which film thickness was 80 nm was formed. The organic luminescence media layer which consisted of organic luminous layer and charge transport layers was formed.

The formation of the charge transport layer and the organic luminescence media layer was performed by relief printing used in the formation of the organic luminescence media layer in example 1.

Same as example 1, second electrode was formed on the organic luminescence media layer which was formed in this way.

It was sealed by glass cap.

Organic electroluminescent device emitted light same as example 1. Luminescence was observed. The luminescence unevenness was equal to or less than 5%.

EXAMPLE 3

The first partition wall and the second partition wall of which heights were 1 μm were formed on substrate same as example 2. The width of the second partition wall was 20 μm. The width of the first partition wall was 40 μm.

Afterwards liquid-repellent processing and the like was performed same as example 1. And organic luminescence media layer was formed same as example 1. Printing area of relief printing plate got over the second partition wall. And printing was performed.

The second partition wall was narrower in comparison with the first partition wall. Therefore, influence of the second partition wall on printing plate was small. Therefore, distance between printing plate and substrate could be shortened. Therefore, the phenomenon that ink remained on printing plate was able to be controlled.

In addition, ink on printing plate was cut by means of the second partition wall naturally. Therefore, ink did not remain on partition wall.

Second electrode was formed afterwards.

Organic electroluminescent device was sealed by glass cap.

Organic electroluminescent device emitted light same as example 1. Luminescence was observed. The luminescence unevenness was equal to or less than 5%.

EXAMPLE 4

Partition wall was formed same as example 1. Liquid-repellent processing and the like were performed to partition wall. Charge transport layer and organic luminous layer were formed on substrate with this partition wall by means of relief printing same as example 2. Organic luminescence media layer was formed in this way.

Afterwards second electrode was formed same as example 1.

Organic electroluminescent device was sealed by glass cap.

Organic electroluminescent device emitted light same as example 1. Luminescence was observed. The luminescence unevenness was equal to or less than 5%.

EXAMPLE 5

Partition wall was formed same as example 1, Liquid-repellent processing and the like were performed to this partition wall. Substrate having this partition wall was prepared in this way.

Subsequently the organic luminescence media layer comprising charge transport layer and organic luminous layer was formed by means of inversion offset printing method.

Polyaniline was used as macromolecule hole transport material. By means of using propanol as solvent, ink was made. Charge transport layer was formed by using this ink.

In addition, the poly fluorene which was macromolecule luminescent material was used as organic luminescent material. By means of dissolving this organic luminescent material in CHB (cyclohexylbenzene), ink was made. Organic luminous layer was formed by means of this ink.

Relief printing plate for the removal of ink has pattern of line-shaped convex area corresponding to the first partition wall. Relief printing plate was set so that line of this relief printing plate corresponding to the first partition wall correspond to curve direction of blanket. Non-printing area of an ink layer on blanket was removed. Shape of printing area left on blanket was line shape corresponding to the first partition wall, and curve direction of blanket was corresponded to the line.

The blanket of which printing area remained touched substrate. And an ink layer was transferred on a substrate.

Same as case of relief printing, alignment of ink pattern corresponding to the first partition wall which remained on blanket and the first partition wall installed on a substrate was performed. And printing was performed.

Printing area of blanket got over the second partition wall. And printing is performed. The second partition wall is lower in comparison with the first partition wall. Therefore, influence of the second partition wall on blanket is small. Therefore, distance between blanket and substrate can be shortened. Therefore, the phenomenon that ink remained on blanket was able to be controlled. In addition, ink on blanket was cut by means of the second partition wall naturally. Therefore, ink did not remain on partition wall.

Afterwards second electrode was formed same as example 1. Organic electroluminescent device was sealed by glass cap.

Organic electroluminescent device emitted light same as example 1. Luminescence was observed. The luminescence unevenness was equal to or less than 5%.

EXAMPLE 6

Inorganic partition wall was not formed on substrate prepared same as example 1. The photosensitive resin of which thickness was 0.8 μm was formed by slit coat method. Apertures corresponding to light emitting areas were formed by exposure/development. Organic partition wall of lattice shape was formed.

This organic partition wall includes the second partition wall which covers an end of the first electrode formed earlier and is parallel to the second straight line, and the first partition wall lower part which is form of sixty-five lines, crosses the first electrode and is parallel to the first straight line.

Next, photosensitive resin which is the same photosensitive resin for the second partition wall and the first partition wall lower part is formed by slit coat method. Thickness of this photosensitive resin is 0.8 μm.

And, by means of exposure/development, the first partition wall upper part of form of stripe was formed on upside of the first partition wall lower part.

A set of the first partition wall upper part and the first partition wall lower part was the first partition wall.

Afterwards liquid-repellent processing and the like were performed same as example 1. Organic luminescence media layer and second electrode were formed same as example 1. Organic electroluminescent device was sealed by glass cap.

Organic electroluminescent device emitted light same as example 1. Luminescence was observed. The luminescence unevenness was equal to or less than 5%.

EXAMPLE 7

Fluorine system additive was added as water-repellent in the organic material which comprised the first partition wall upper part. Liquid-repellent processing was performed by heat hardening at 200 degrees Celsius. Liquid-repellent processing by $CF_4$ plasma was not performed.

Organic electroluminescent device was made same as example 1 besides the above described processing.

It was sealed by glass cap.

Organic electroluminescent device emitted light same as example 1. Luminescence was observed. The luminescence unevenness was equal to or less than 5%.

EXAMPLE 8

A back plane for top emission type was used. A top emission back plane was formed so that organic transistor was connected with first electrode via contact hole formed in flattening membrane. Organic transistor functions as a switching element.

The pixel number of a back plane for top emission was 240*320 dots. The number of the subpixels of a back plane for top emission was 720*320 dots.

And first electrode was provided by pattern formation by sputtering method of chromium. The first electrode was 120 μm*360 μm pitch.

As for the space between subpixels, length was 40 μm, and width was 100 μm.

The photosensitivity polyimide resin of which thickness was 1.2 μm was formed on the substrate by slit coat method. By exposure/development, apertures corresponding to light emitting areas were formed. Organic partition wall of lattice shape was formed in this way.

This organic partition wall includes the second partition wall which covers an end of the first electrode and is parallel to the second straight line, and the first partition wall which crosses over the first electrode and is parallel to the first straight line.

Some processing is performed in the same manner as in Example 1. After surface treatment of the first electrode by $O_2$ plasma treatment was performed, liquid-repellent processing of the first partition wall upper part comprising organic materials by $CF_4$ plasma was performed.

Apertures sectioned by the first partition wall and the second partition wall were provided with macromolecule hole transport material ink adjusted same as example 1. This ink was dried. The charge transport layer of which thickness was 50 nm was formed.

Subsequently macromolecule luminescent material ink adjusted same as example 1 was provided with. This ink was dried. The organic luminous layer of which thickness was 80 nm was formed.

Organic luminescence media layer comprising organic luminous layer and charge transport layer was formed in this way.

The formation of charge transport layer and organic luminous layer was performed by relief printing used in the formation of the organic luminescence media layer in example 1.

Subsequently, as second electrode, the Ca of which thickness was 20 nm was formed by vacuum evaporation. ITO membrane was formed by sputtering method afterwards.

Organic electroluminescent device was sealed by sticking glass plate with the use of heat curing type adhesive under the nitrogen atmosphere of which dew point was −80 degrees and oxygen concentration was 1 ppm without exposure to the atmosphere air.

This organic electroluminescent device emitted light in the same manner as in example 1. Luminescence was observed. The luminescence unevenness was equal to or less than 25%.

The present invention is preferably used in the formation of organic functional thin film by relief printing with the use of plastic plate. By way of example only, the present invention is preferably used in the formation of organic electroluminescent device of active driving type by relief printing with the use of plastic plate shown in FIG. 8. In organic electroluminescent device of the active driving type of which first electrode is pixel electrode, partition wall of lattice-shaped is formed between pixel electrodes. Plastic plate having dot-shaped printing area corresponding to each pixel electrodes was used conventionally. Ink on convex parts was transferred to every each pixel electrodes surrounded with partition wall of lattice shape. A schematic view of plastic plate having dot-shaped printing area (convex part) is shown in FIG. 9A.

Resin used for plastic plate transforms due to solvent of ink and thermal expansion.

Therefore, the size of plastic plate changes. Design and fabrication of plastic plate are usually performed in consideration of these size fluctuations. In dot-shaped plastic plate of FIG. 9A, it is necessary to use the plastic plate which is made in consideration of size fluctuations in two directions of the first straight line direction 100 of a substrate and the second straight line direction 200 of a substrate. The design of such a plastic plate was difficult. In addition, it was difficult that the ink on convex parts of plastic plate having dot-shaped convex parts was provided on each pixel electrodes surrounded with partition wall and the ink was transferred entirely from dot-shaped convex parts to desired area.

Figure 9B:
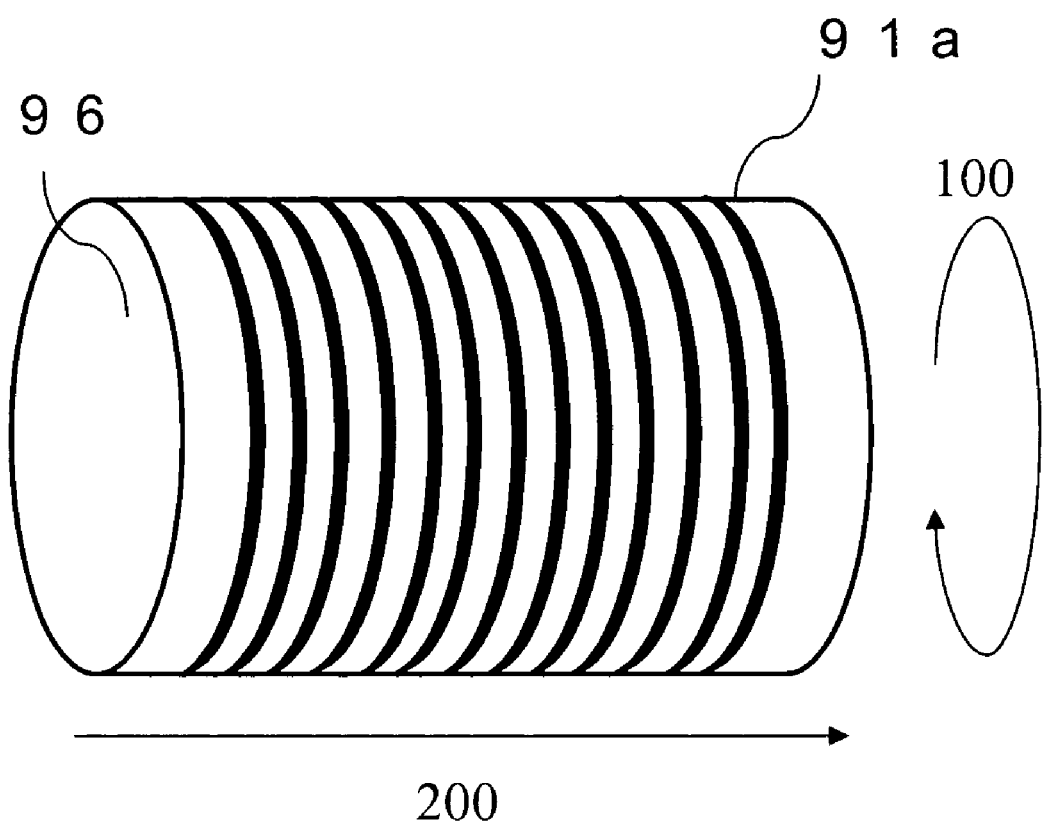
FIG. 9B is a schematic view of plastic plate having stripe-shaped printing area (convex part).

On the other hand, in the present invention, the plastic plate of which printing-area (convex part) is stripe geometry was used in the formation of organic luminous layer of organic electroluminescent device of active driving type. A schematic view of plastic plate having stripe-shaped printing area (convex part) is shown in FIG. 9B. In the case of plastic plate having stripe-shaped printing area shown in FIG. 9B, size fluctuation of plastic plate in direction corresponding to the second straight line 200 of a substrate should be considered mainly. Size fluctuation in direction corresponding to the first straight line 100 does not have to be considered almost. Thus, a design of plastic plate becomes easy. According to the present invention, ink on convex parts should be transferred to desired area surrounded with the first partition wall with the use of stripe-shaped plastic plate. Therefore, organic electroluminescent device of the active driving type of which accuracy of dimension is preferable can be obtained.

What is claimed is:

1. A manufacturing method of a printed matter which includes a substrate, partition walls, an organic functional thin film formed in a domain sectioned by the partition walls,
    wherein the partition walls are lattice-shaped including a first partition wall parallel to a first straight line and a second partition wall parallel to a second straight line,
    the method includes forming the organic functional thin film by printing with the use of a printing plate of which a stripe-shaped printing area corresponds to the first partition wall, wherein the stripe-shaped printing area gets over the second partition wall in the printing.

2. The manufacturing method of a printed matter according to claim 1, wherein a width of the second partition wall is narrower than that of the first partition wall.

3. The manufacturing method of a printed matter according to claim 1, wherein a thickness of the second partition wall is less than that of the first partition wall.

4. The manufacturing method of a printed matter according to claim 3,
    the method further comprising:
    forming a lattice shape partition wall including the second partition wall and a first partition wall lower part; and
    forming a stripe-shaped first partition wall upper part on the first partition wall lower part.

5. The manufacturing method of a printed matter according to claim 1, wherein the printing plate is a relief printing plate.

6. The manufacturing method of a printed matter according to claim 5,
    the method further comprising:
    transferring an organic functional ink to a convex part of the relief printing plate attached on a plate cylinder; and
    transferring the organic functional ink on the convex part to predetermined positions of the substrate,
    wherein the relief printing plate moves in correspondence with rotation of the plate cylinder while the convex part is close against the substrate.

7. The manufacturing method of a printed matter according to claim 6, wherein a direction of the stripe-shaped printing area corresponds to a curve direction of the plate cylinder, and
    wherein the direction of the stripe-shaped printing area is a printing direction.

8. The manufacturing method of a printed matter according to claim 1, wherein the printing is inversion offset printing.

9. The manufacturing method of a printed matter according to claim 1, wherein the organic functional thin film is an organic luminescence media layer between a first electrode under the layer and a second electrode over the layer.

10. The manufacturing method of a printed matter according to claim 1, wherein the organic functional thin film is a charge transport layer.

11. The manufacturing method of a printed matter according to claim 1, wherein the organic functional thin film is a luminous layer.

* * * * *